(12) United States Patent (10) Patent No.: US 6,894,530 B1
Davidson et al. (45) Date of Patent: May 17, 2005

(54) PROGRAMMABLE AND FIXED LOGIC CIRCUITRY FOR HIGH-SPEED INTERFACES

(75) Inventors: Allan T. Davidson, San Jose, CA (US); Satwant Singh, Fremont, CA (US); Shari L. Mann, Sandy, UT (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 85 days.

(21) Appl. No.: 10/425,862

(22) Filed: Apr. 28, 2003

(51) Int. Cl.$^7$ .......................................... H03K 19/173
(52) U.S. Cl. ........................................ 326/38; 326/41
(58) Field of Search .............................. 326/38, 39, 40, 326/41

(56) References Cited

U.S. PATENT DOCUMENTS 6,426,649 B1    7/2002   Fu et al.
6,483,343 B1   11/2002   Faith et al.
6,608,500 B1 *  8/2003   Lacey et al. ................. 326/39
6,674,303 B1 *  1/2004   Morse et al. ................. 326/41

* cited by examiner

*Primary Examiner*—Daniel Chang
(74) *Attorney, Agent, or Firm*—MacPherson Kwok Chen & Heid LLP; Greg J. Michelson

(57) ABSTRACT

Systems and methods are disclosed for programmable logic devices requiring a high-speed input/output interface. Hard-macro circuits that are configurable, scalable, and cascadable complement the input/output drivers and the programmable core logic of the programmable logic device. The hard-macro circuits are permanent, high-speed logic circuits that are optimized for the performance requirements of high-speed input/output interface standards. High-speed memory interfaces, clock and data recovery interface standards, source-synchronous interface standards, and system-synchronous interface standards may be supported by the hard-macro circuits.

21 Claims, 17 Drawing Sheets

PROGRAMMABLE AND FIXED LOGIC CIRCUITRY FOR HIGH-SPEED INTERFACES

TECHNICAL FIELD

The present invention relates generally to electrical circuits and, more particularly, to electrical circuits for a high-speed interface.

BACKGROUND

There has been a growing proliferation of high-speed input/output interface standards (i.e., agreed principles and protocols) directed towards various applications within the electronics industry. These standards generally address chip-to-chip interfaces, board-to-board interfaces, and box-to-box interfaces for a wide range of emerging applications, such as data packet processing, data bus bridges, and high-speed memory interfacing, to name but a few.

Certain programmable devices (or chips), such as programmable logic devices (e.g., including complex programmable logic devices and field programmable gate arrays) can potentially handle a wide range of input/output interface standards because of their flexible programmable circuitry. Specifically, the core logic of the programmable device may be programmed to accommodate the desired input/output standards by performing the necessary logic.

A drawback of programmable devices is that their input/output performance is generally limited due to the nature of the flexible, programmable circuitry. For example, a signal propagating through a programmable device's general programmable circuitry will typically take longer than through circuitry (e.g., input/output circuitry) specifically designed for the desired function or application. Consequently, programmable devices are more suited to medium-frequency logic and interface applications than the emerging high-speed input/output interface applications.

A drawback of devices that have fixed-functions or non-scalable interfaces (e.g., a peripheral component interconnect (PCI) interface) is that they are typically limited to the set of input/output standards that the circuitry was specifically designed (i.e., hard-wired) to accommodate. For example, a device may have a specific circuit designed for each type of input/output interface standard that the device supports. A drawback of this approach is that it becomes difficult to select which combination of specific circuits should be incorporated into the device due to the large number of existing standards and the rapid pace at which they continue to emerge and evolve. As a result, there is a need for systems and methods to address the high-speed input/output interface for devices.

SUMMARY

Systems and methods are disclosed herein to provide high-speed input/output interfacing for a device (e.g., a programmable logic device). For example, in accordance with an embodiment of the present invention, scalable hard macros for high-speed input/output interfacing complement the programmable logic circuitry of a programmable logic device. The hard macros are implemented in permanent, high-speed logic situated between the programmable input/output drivers and the programmable logic circuitry (i.e., programmable core logic) of the programmable logic device. The hard macros are configurable circuitry that are specifically optimized for the performance requirements of high-speed input/output interface standards and, therefore, are more suited to the high-speed requirements than the programmable core logic that is optimized for flexibility. Consequently, devices, such as programmable logic devices, incorporating the architecture or techniques disclosed herein can address the high-speed input/output interface applications, which are generally not feasible for traditional programmable devices.

More specifically, in accordance with one embodiment of the present invention, a programmable device includes a first input/output driver; a first input/output circuit coupled to the first input/output driver and configurable to support a plurality of input/output interface standards requiring source-synchronous clock signals and/or system-synchronous clock signals; and a programmable core circuit coupled to the first input/output circuit.

In accordance with another embodiment of the present invention, a method for supporting a plurality of input/output interface standards by a programmable device, the method includes supporting a range of electrical signaling levels; providing configurable circuits adapted to support high-speed requirements of the input/output interface standards; and providing the ability to transfer data to and from programmable core logic within the programmable device through the configurable circuits, wherein at least one of the configurable circuits is adapted to support the input/output interface standards requiring clock and data recovery and at least one of the configurable circuits is adapted to support the input/output interface standards requiring source-synchronous and/or system-synchronous input/output interface standards.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION

Figure 1:
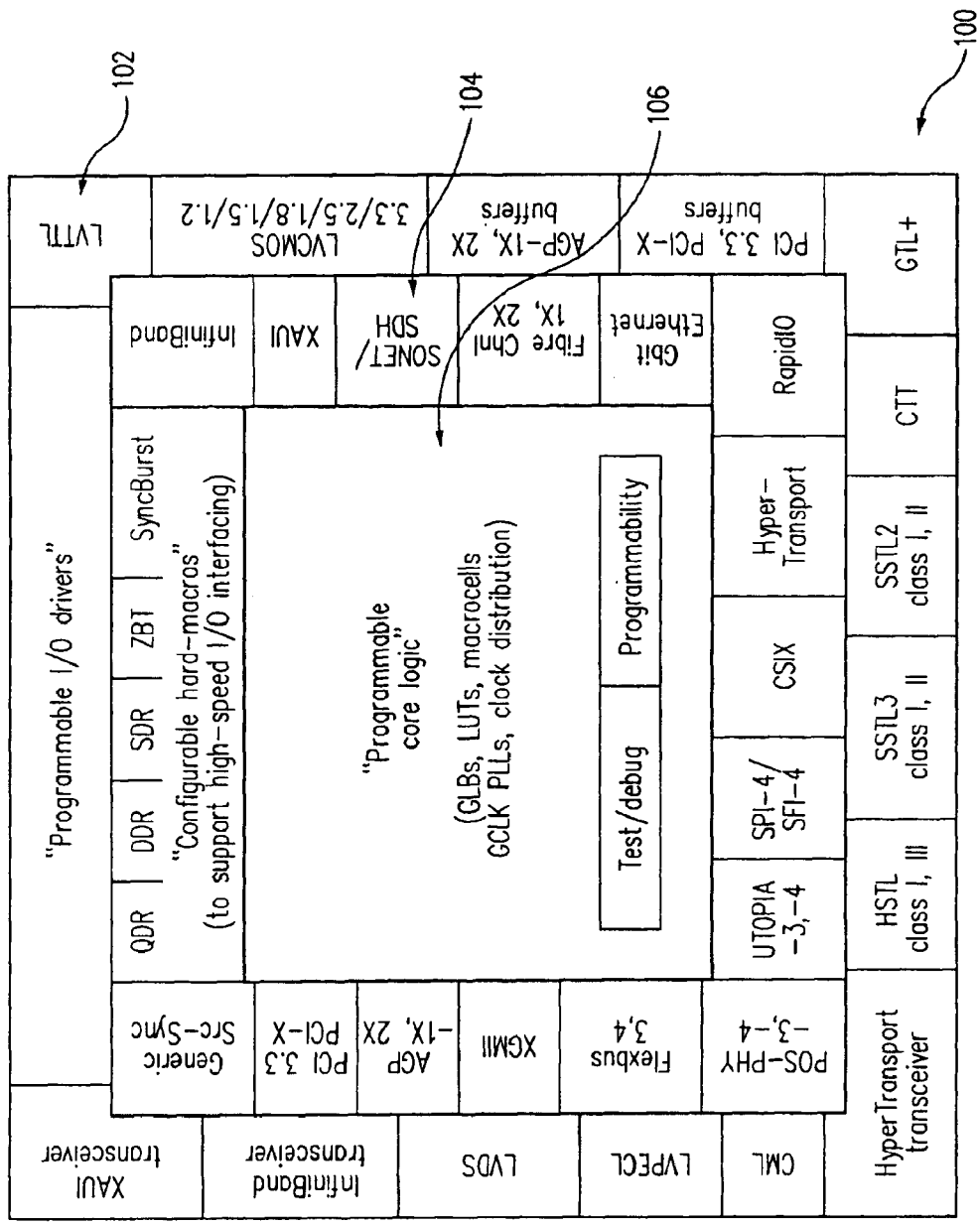
FIG. 1 shows a block diagram illustrating a device in accordance with an embodiment of the present invention.

FIG. 1 shows a block diagram illustrating a device 100 having an architecture in accordance with an embodiment of the present invention. Device 100 represents any type of electrical device (e.g., an integrated circuit or chip) that requires a high-speed input/output interface. For example, device 100 is a programmable logic device, such as a complex programmable logic device or a field programmable gate array. Device 100 includes input/output drivers 102, hard-macro circuits 104, and core circuits 106.

Input/output drivers 102 can support a wide range of electrical signaling levels required for the standard interfaces. For example, input/output drivers 102 may be programmable input/output drivers positioned as an outer ring of circuitry, as shown on the block diagram of device 100. Exemplary types of electrical signaling levels that may be supported by input/output drivers 102 are listed (e.g., such as LVCMOS, SSTL, HSTL, and LVDS) on the outer ring in FIG. 1. However, the electrical signaling levels that are listed are not limiting and many other types of signaling levels may be supported.

Core circuits 106 includes programmable core logic, such as for example, logic blocks, lookup tables, macro cells, and/or other types of programmable circuitry that may be found on conventional programmable logic devices. Core circuits 106 may also include various other circuitry, such as clock distribution circuits, global clock phase-locked loops, test or debug circuitry, and circuits to aid in the programming of the core logic. The programmable core logic of core circuits 106 is generally very flexible in terms of its functions, but is limited in performance (e.g., speed) due to this flexibility.

The performance available from input/output drivers 102 is typically much higher than that available from the programmable core logic of core circuits 106. However, the full performance of input/output drivers 102 has been traditionally unused in conventional programmable devices, because the performance of the programmable device is limited by the slowest section, which is generally the programmable core logic.

In accordance with an embodiment of the present invention, situated between core circuits 106 and input/output drivers 102 are hard-macro circuits 104. Hard-macro circuits 104 (also referred to herein as input/output circuits) are permanent logic or circuits that are scalable and optimized in terms of performance to operate at the clock rates required by the high-speed input/output interface standards and protocols. For example, hard-macro circuits 104 may be configurable to some extent to accommodate a range of interface standards and may be positioned, as shown in FIG. 1, as a central ring of circuitry around core circuits 106 and within the outer ring of input/output drivers 102.

Exemplary types of interface standards that may be supported by hard-macro circuits 104 are listed (e.g., XAUI, CSIX, XGMII, and RapidIO) on the central ring in FIG. 1. However, the interface standards that are listed are not limiting and many other types of interface standards may be supported.

Hard-macro circuits 104 use permanent (i.e., hard-wired) logic designed for the high-speed input/output interface standards, while maintaining some programmability or configurability to provide for a wide range of interface standards. Because hard-macro circuits 104 use permanent logic, they support much higher performance levels than is available from equivalent logic implemented in the programmable core of core circuits 106.

In general, hard-macro circuits 104 provide the necessary circuitry or interface between input/output drivers 102 and core circuits 106 to support the high-speed input/output interface standards. The connection between hard-macro circuits 104 and input/output drivers 102 is matched to the performance required to support the high-speed interface standards and protocols. The connection between hard-macro circuits 104 to the programmable core logic of core circuits 106 is matched to the performance available from the programmable core logic.

The lower speed logic (e.g., interface controllers, FIFO buffers, and state machines) that does not require the performance of hard-macro circuits 104 may be mapped into the programmable core logic of core circuits 106 to complete the logic requirements of the high-speed input/output interface. Alternatively, when the interface requires only a low-speed input/output interface (e.g., a low-speed system-synchronous standard) such that the bit-rate at the pins of device 100 is low enough to allow a direct transfer of data to and from core circuits 106, then hard-macro circuits 104 can be bypassed.

Hard-macro circuits 104 may be viewed as a configurable system input/output interface that supports various high-speed input/output interface standards (e.g., packet based interface standards and memory interfaces). Hard-macro circuits 104 adjust for the difference in the bit-rate of data at the pins of device 100 and the maximum operating frequency of the core logic within device 100. In a sense, hard-macro circuits 104 function as a "digital gearbox," which slows down and widens the data (e.g., increases the number of parallel bits of data) as it enters device 100 and speeds up and narrows the data (e.g., decreases the number of parallel bits of data) as it exits device 100. Hard-macro circuits 104 also can generate and receive the source-synchronous clocks and perform clock and data recovery for those interface standards that require this function.

The architecture of device 100 is scalable for various device sizes. Also, multiple hard-macro circuits 104 can be cascaded to implement wider interfaces than would be feasible with a single macro. Consequently, a family of devices can be created, with the number of hard-macro circuits 104 included on each device within the family chosen based on the size of the device and the intended applications.

Figure 2A:
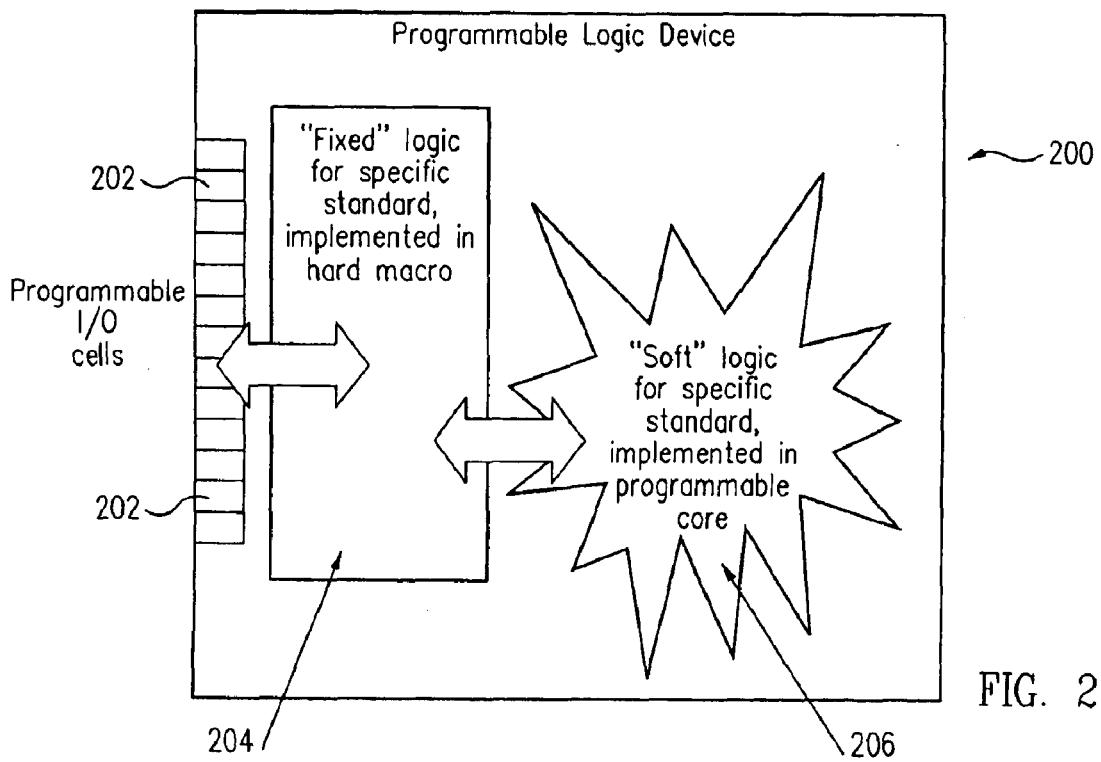
FIGS. 2a and 2b show block diagrams illustrating a device in accordance with an embodiment of the present invention.
Figure 2B:
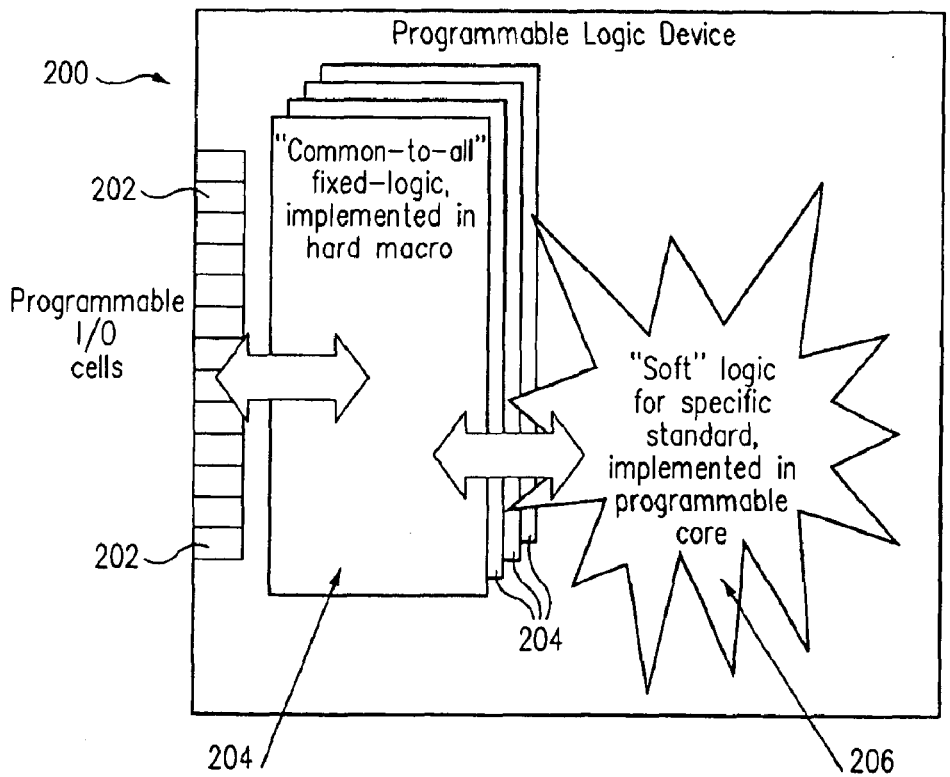

FIGS. 2a and 2b show a block diagram illustrating a device 200 in accordance with an embodiment of the present invention. Device 200 represents any type of electrical device (e.g., an integrated circuit or chip) that requires a high-speed input/output interface. For example, device 200 is a programmable logic device, such as a complex programmable logic device or a field programmable gate array. Device 200 includes input/output drivers 202, input/output circuits 204, and programmable circuits 206.

Input/output drivers 202 receive information (e.g., data) from an interface (not shown) between device 200 and external circuitry (e.g., other systems or devices) and provide this data to input/output circuits 204. Input/output drivers 202 also transmit data received from input/output circuits 204 to the interface, which provides the information to external devices. The interface may be any type of electrical or other type of communication interface (e.g., wired or wireless). For example, the interface may comprise wires or traces for transferring the electrical signals between device 200 and external circuitry (e.g., a chip-to-chip interface).

Input/output drivers 202 are, for example, programmable input/output drivers or cells that can support a wide range of electrical signaling levels required for the standard interfaces. Exemplary types of electrical signaling levels include LVCMOS, SSTL, HSTL, and LVDS, but these are not limiting and many other types of signaling levels may be supported.

Input/output circuits 204 receive the data from and provide data to input/output drivers 202, with input/output circuits 204 ultimately providing data or information to programmable circuits 206, as illustrated in FIG. 2a. Input/output circuits 204 are circuits that may be viewed as "fixed" logic and implemented as hard-macro circuits (situated between input/output drivers 202 and programmable circuits 206), which are optimized for performance to support one or more of the high-speed input/output interface standards. The term hard-macro refers to building blocks, cells, or logic, for example, that collectively perform an intended function or application.

Programmable circuits 206 may include the programmable core logic of device 200, such as for example, logic blocks, lookup tables, macro cells, and/or other types of programmable circuitry that may be found on conventional programmable logic devices. Alternatively, programmable circuits 206 may be separate from the programmable core logic of device 200 and represent programmable circuitry that may be part of input/output circuits 204 or separate from input/output circuits 204 and the programmable core logic of device 200.

Programmable circuits 206 may be viewed as "soft" logic that is optimized for flexibility to provide the logic necessary to complete the logic requirements of one or more of the supported high-speed input/output interface standards. For example, programmable circuits 206 may be utilized to perform the lower-speed logic (e.g., interface controllers, FIFO buffers, and state machines) that does not require the high-speed circuitry of input/output circuits 204.

In general, FIG. 2a illustrates a technique in accordance with an embodiment of the present invention for a programmable logic device to support one or more high-speed input/output interface standards. Each of the high-speed input/output interface standards is decomposed into a high-speed fixed-logic portion dedicated to that standard and a lower-speed soft-logic portion. The high-speed fixed-logic portion is supported by input/output circuits 204, while the lower-speed soft-logic portion is supported by programmable circuits 206 (e.g., the programmable core logic of device 200) that are programmed to meet the remaining requirements of the high-speed input/output interface standard. Alternatively in accordance with an embodiment of the present invention, for input/output interface standards that do not require high-speed performance, input/output circuits 204 can be bypassed and the requirements of the input/output interface standard supported by programmable circuits 206.

FIG. 2b shows a block diagram illustrating device 200 in accordance with an embodiment of the present invention. Device 200 illustrates how one input/output circuit 204 can support a number of input/output interface standards by performing the common features of the input/output interface standards. For example, each input/output circuit 204 may support more than one type of input/output interface standard (i.e., fixed-logic common-to-all input/output interface standards).

Device 200 also illustrates how input/output circuits 204 can be expanded or scaled to accommodate a large number of potentially different high-speed input/output interface standards. By incorporating additional input/output circuits 204 on device 200, a larger number of input/output interfaces can be supported. Also, input/output circuits 204 can be cascaded to support wider data widths for the input/output interface standards. Furthermore, one or more of input/output circuits 204 may differ from each other or be of a different type of hard-macro, as discussed herein, to support different types or groups of the input/output interface standards.

For device 200, the connection or electrical coupling between input/output drivers 202 and input/output circuits 204 must support the performance requirements that are required by the desired high-speed input/output interface standards (i.e., protocols). The connection or electrical coupling between input/output circuits 204 and programmable circuits 206 must support at least the performance that is available from programmable circuits 206.

FIGS. 2a and 2b illustrate a technique in accordance with some embodiments of the present invention that recognizes and extracts the commonality between the numerous input/output interface standards and implements this in a device as a combination of fixed and programmable circuitry. The common, high-speed portion of the input/output interface standards is extracted and implemented in a configurable "fixed" circuit (e.g., input/output circuits 204) that is optimized for the high-speed requirements. The application-specific, lower-speed portion of the input/output interface standards (e.g., interface controllers, protocol state machines, and buffering) is extracted and implemented in programmable circuitry (e.g., programmable circuits 206).

By recognizing and extracting the underlying commonality between the standards (implemented in input/output circuits 204) and dealing with the difference between them in programmable circuits 206 (e.g., the programmable core logic of the device), a single hard-macro or a limited number of hard-macros can be developed that address a large number of input/output interface standards and protocols. This solves the problems inherent in a scheme that has one separate hard-macro or circuit specifically for each input/output interface standard and no reliable method to predict what mixture of such macros should be included on a general purpose programmable device.

Figure 3:
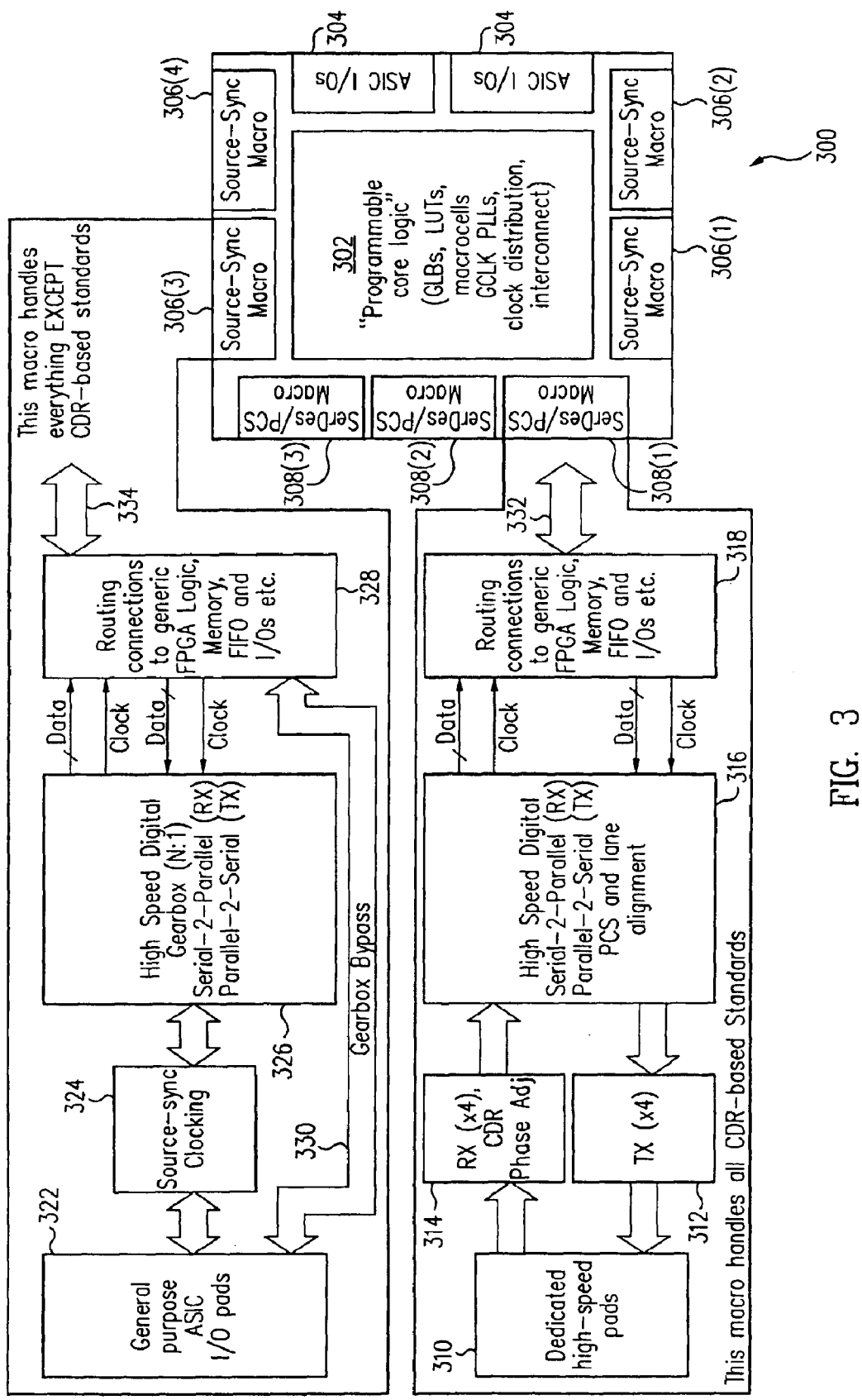
FIG. 3 shows a block diagram illustrating a device having two types of input/output circuits in accordance with an embodiment of the present invention.

FIG. 3 shows a block diagram illustrating a device 300 having two types of input/output circuits in accordance with an embodiment of the present invention. Device 300, for example, is a programmable device (e.g., a programmable logic device) having programmable core circuits 302 (labeled programmable core logic). Programmable core circuits 302 includes various programmable circuitry, such as for example, logic blocks, lookup tables, and macro cells along with possibly other circuitry, such as global clock phased-locked loops, clock distribution circuits or networks, programmable interconnects, and circuitry to aid in the programming of the core logic.

Device 300 further includes input/output interfaces 304, input/output interfaces 306 [which are separately referenced as 306(1) through 306(4)], and input/output interfaces 308 [which are separately referenced as 308(1) through 308(3)]. Input/output interfaces 304 are, for example, general purpose programmable synchronous or asynchronous input/output interfaces, with programmable input/output drivers.

Input/output interfaces 306 and input/output interfaces 308 represent two types of hard-macro circuits (i.e., input/output circuits), such as for example input/output circuits 104 or 204. Specifically, input/output interfaces 308 (labeled SerDes/PCS macros) represent one type (i.e., type 1) of circuit or hard-macro for one group of high-speed input/output interface standards and input/output interfaces 306 (labeled Source-Sync macros) represent another type (i.e., type 2) of circuit or hard-macro for another group of high-speed input/output interface standards.

Device 300 illustrates an exemplary implementation having two-different hard-macros (i.e., SerDes/PCS macro and Source-synchronous macro) that support many different high-speed input/output interface standards. For example, a total of eighteen or more input/output interface standards can be supported through the implementation of these two types of hard-macros. The common, high-speed parts of the input/output interface standards are supported by the hard-macro circuits (i.e., input/output interfaces 306 and 308). The lower-speed portions (e.g., the low-speed differences or application-specific portion of the input/output interface standards) are implemented in programmable core circuits 302.

Device 300 does not require all three input/output interfaces (i.e., input/output interfaces 304, 306, and 308) to be present. Rather, device 300 may only require input/output interfaces 306 or input/output interfaces 308 to be present or both, depending upon the intended application. The input/output interfaces can also be positioned in any manner on device 300, depending upon the number of the input/output interfaces and various other factors (e.g., chip layout constraints). Further details regarding exemplary device architectures can be found in U.S. patent application Ser. No. 10/425,863 entitled "Scalable Device Architecture for High-speed Interfaces" and filed on Apr. 28, 2003, which is incorporated herein by reference in its entirety.

Device 300, through the use of input/output interfaces 306 and/or input/output interfaces 308, can support various high-speed input/output interface standards, such as for example the emerging packet-based, high-bandwidth input/output interface standards (e.g., XAUI, InfiniBand, RapidIO, HyperTransport, and CSIX). Device 300, using input/output interfaces 306 and/or input/output interfaces 308, also support interfacing with high-speed memory devices (e.g., synchronous memory such as those with double data rate or quad data rate memory interfaces).

Input/output interfaces 306 support, for example, input/output interface standards that utilize parallel, unidirectional, point-to-point links, where the data and the clock are sent from the transmitting device to the receiving device (i.e., across the interface to and from device 300) on parallel, matched length paths. Generally, a known timing relationship is preserved between the clock and the data, which allows the receiving device to use the incoming clock to sample the incoming data. Because the clock is transmitted separately from the data, there is no need to encode the data and no need for clock and data recovery (CDR) circuits in the receiver. Exemplary source-synchronous input/output interface standards include, but are not limited to, RapidIO, HyperTransport, SPI-4 Phase 1 or 2, POS-PHY4, Flexbus 4, SFI-4, Utopia-4, XGMII, QDR memory, DDR memory, CSIX, AGP-2X, and various other general or generic source-synchronous standards.

Input/output interfaces 306 may also support system-synchronous (common clock) input/output interface standards that utilize parallel links that may or may not be point-to-point and that are often bi-directional. The clock for all devices is common and is distributed to all devices (e.g., device 300 and other devices) in the link through a matched length clock distribution. As an example, common bus standards such as PCI and AGP-1X fall into this category. Exemplary system-synchronous (common clock) input/output interface standards include, but are not limited to, SPI-3, POS-PHY3, Utopia3, Flexbus 3, SDR memory, ZBT memory, SyncBurst memory, PCI-X, PCI 3.3, AGP-1X, and various other general or generic system-synchronous standards.

Input/output interfaces 308 support, for example, input/output interface standards that utilize serial, unidirectional, point-to-point links, where the clock is embedded in the data stream. The transmitting device includes some type of data encoder (e.g., an 8 bit/10-bit encoder) that guarantees a minimum number of transitions in a given time period. The different input/output interface standards typically select various encoding schemes based on the tradeoff of overhead in the data stream versus robustness of the link. The receiving device includes a CDR circuit that locks to the incoming serial data stream and recovers the clock from the data. The incoming data is then sampled by this recovered clock and generally is re-aligned and decoded to obtain the original transmitted data. Exemplary CDR input/output interface standards include, but are not limited to, XAuI, InfiniBand, VSR4, 2X Fibre Channel, Fibre Channel, Gbit Ethernet, and various other general or generic CDR standards.

In general, input/output interfaces 306 and 308 adjust for the difference in the bit-rate of information (e.g., data) entering device 300 (e.g., at the pins) and the maximum operating frequency of programmable core circuits 302 (e.g., the maximum bit-rate accepted by core logic). Input/output interfaces 306 and 308 can be thought of as a "digital gearbox" that slows down and widens the data as it enters device 300 and speeds up and narrows the data as it leaves device 300. In addition to the digital gearbox effect, input/output interfaces 306 and 308 perform various other functions, such as for example generating and receiving source-synchronous clocks and performing clock and data recovery for those input/output interface standards that require these functions.

As explained in further detail herein, each of input/output interfaces 306 [i.e., input/output interfaces 306(1), 306(2), 306(3), or 306(4)] and each of input/output interfaces 308 [i.e., input/output interfaces 308(1), 308(2), or 308(3)] are independently configurable to support multiple different input/output interfaces simultaneously (e.g., to allow for efficient implementation of bus-bridges and protocol switches). Input/output interfaces 306 and 308 are also configurable to support different options required for each input/output interface standard that is supported. For example, the data width, interface clocking rate, clock-to-data alignment, active clock edge selection and the clock source may be configurable or adjustable (e.g., by a user of the device).

The number of input/output interfaces 306 and 308 on a device, such as device 300, can vary as desired to provide scalability of input/output interfaces 306 and 308 within a device family having a range of device sizes. For example, as the device size within a family of devices increases, the number of input/output interfaces 306 and 308 can also increase to accommodate a growing number of input/output interfaces that are supported by the larger devices.

Furthermore, input/output interfaces 306 or input/output interfaces 308 can be cascaded to offer wider input/output interface data widths (i.e., a larger number of parallel paths for a given input/output interface). The cascade capability of input/output interfaces 306 and 308 also benefits the scalable capability because input/output interfaces 306 and 308 may be designed to support the minimum data widths, such as for easier incorporation into smaller devices, and then cascaded to support wider input/output interface data widths as required. Consequently, input/output interfaces 306 and 308 are flexible and configurable to support wide input/output interfaces or numerous narrower input/output interfaces for a large number of input/output interface standards.

Input/output interface 306(3) is shown in an expanded view to illustrate exemplary block diagram circuit schematics for input/output interfaces 306. Input/output interface 306(3) includes input/output pads 322, source-sync clocking circuits 324, transmit and receive circuits 326, and routing circuits 328. Input/output pads 322 are, for example, general purpose programmable input/output pads or general purpose high-speed input/output pads. Source-sync clocking circuits 324 perform the clocking functions by generating source-synchronous and system-synchronous clocks for transmission with the data through input/output pads 322 or receiving source-synchronous and system-synchronous clocks from input/output pads 322 for use by transmit and receive circuits 326. Source-sync clocking circuits 324 can support, for example, single data rate, double data rate, or quad data rate.

Transmit and receive circuits 326 include serial-to-parallel circuits for the receive (RX) path and parallel-to-serial circuits for the transmit (TX) path. The serial-to-parallel circuits widen the data stream received from input/output pads 322 and source-sync clocking circuits 324 and provide this data along with a clock to routing circuits 328. The parallel-to-serial circuits narrow the data received from programmable core circuits 302 through routing circuits 328 and provide this data along with a clock to source-sync clocking circuits 324 and input/output pads 322.

Transmit and receive circuits 326 form a high-speed programmable digital gearbox that slows down and widens the data as it enters device 300 and speeds up and narrows the data as it leaves device 300. The degree to which the data is widened or narrowed can be represented by the gearbox ratio "N", which can be calculated and used to program transmit and receive circuits 326. The gearbox ratio "N" is determined by dividing the data rate entering device 300 (e.g., at the pins of device 300) by the data rate between input/output interface 306(3) and programmable core circuits 302. Consequently, the amount that the data is widened or narrowed is dependent upon the performance available from programmable core circuits 302 and the rate at which data is flowing through input/output pads 322.

As shown by information path 330 (labeled gearbox bypass), source-sync clocking circuits 324 and transmit and receive circuits 326 can be bypassed. For example, when device 300 is interfacing with a device that requires only a low-speed interface (e.g., a low-speed system synchronous input/output interface standard), then transmit and receive circuits 326 are bypassed because the bit-rate at the pins of device 300 is slow enough (i.e., within the performance range of programmable core circuits 302) to allow a direct transfer of data to and from programmable core circuits 302 (e.g., the core of device 300).

Routing circuits 328 provide the routing connections to programmable core circuits 302, which may include logic blocks, field programmable gate array logic, complex programmable logic, and memory along with other associated circuitry, such as buffers and registers. Arrow 334 illustrates that information is flowing to and from input/output interface 306(3) to programmable core circuits 302.

Input/output interface 308(1) is shown in an expanded view to illustrate exemplary block diagram circuit schematics for input/output interfaces 308. Input/output interface 308(1) includes input/output pads 310, transmit circuits 312, receive circuits 314, gearbox and coding circuits 316, and routing circuits 318. Input/output pads 310 are, for example, dedicated high-speed input/output pads.

As an example, four transmit circuits 312 and four receive circuits 314 are provided within input/output interface 308(1). Each transmit circuit 312 performs serialization of parallel data (e.g., 8:1 or 10:1 serialization) and may also contain a programmable output driver with multiple levels of programmable pre-emphasis to equalize different drivers and transmission path lengths. Transmit circuits 312 receive a transmit clock signal and may also receive various control signals.

Each receive circuit 314 recovers the clock from the incoming data stream by performing clock and data recovery and deserialization (e.g., 1:8 or 1:10 deserialization) and may also perform phase and/or byte adjustment or alignment. For example, 1:8 deserialization is used with scrambled SONET data while 1:10 deserialization is used with 8-bit/10-bit encoded data streams. In general as an example, each receive circuit 314 includes a CDR circuit that phase-locks to the data stream and extracts both the clock information and the data bits themselves and provides an 8 bit or 10-bit wide data stream and the recovered clock signal to gearbox and coding circuits 316.

The transmit circuits 312 and receive circuits 314 function as a high-bandwidth transceiver and perform the serializer/deserializer (also referred to herein as SerDes) function for input/output interface 308(1). Common circuitry may be formed and utilized by transmit circuits 312 and receive circuits 314 to receive a reference clock and distribute appropriate clocks to transmit circuits 312 and receive circuits 314. For example, the common circuitry or common block may receive a reference clock from an oscillator and use clock multiplication phased-locked loops to generate high-speed clocks from the lower frequency reference clock. The high-speed clocks are distributed to transmit circuits 312 and receive circuits 314.

Gearbox and coding circuits 316 include serial-to-parallel circuits for the receive (RX) path and parallel-to-serial circuits for the transmit (TX) path. The serial-to-parallel circuits widen the data stream received from receive circuits 314 and provide this data along with a clock to routing circuits 318. The parallel-to-serial circuits narrow the data received from programmable core circuits 302 through routing circuits 318 and provide this data to transmit circuits 312.

Gearbox and coding circuits 316 form a high-speed programmable digital gearbox that slows down and widens the data as it enters device 300 and speeds up and narrows the data as it leaves device 300. The degree to which the data is widened or narrowed can be represented by the gearbox ratio "N," which can be calculated as discussed above and used to program gearbox and coding circuits 316. Specifically, the gearbox ratio "N" is determined by dividing the data rate entering gearbox and coding circuits 316 by the data rate between input/output interface 308(1) and programmable core circuits 302. Consequently, the amount that the data is widened or narrowed is dependent upon the performance available from programmable core circuits 302 and the rate at which data is flowing through input/output pads 310.

Gearbox and coding circuits 316 further includes a four-lane physical coding sublayer (PCS) that communicates with all four transmit and receive lanes (i.e., data paths through transmit circuits 312 and receive circuits 314) and performs lane alignment. The four lanes, for example, can be configured as four independent lanes (e.g., for Gbit Ethernet, Fibre Channel, 2X Fibre Channel, and InfiniBand) or as a four-lane group (e.g., for VSR4-03.0 or InfiniBand). The lanes can also be cascaded. For example, the lanes can be combined with other input/output interfaces, such as input/output interfaces 308(2) and 308(3), by linking the PCS in each input/output interface 308 to form a twelve-lane group (e.g., for VSR4-01.0 or InfiniBand).

The PCS may perform several functions on both the transmitted and received data depending upon the input/output interface standard being supported. For example for the received data, the PCS receives parallel data from receive circuits 314 and performs functions such as programmable and maskable comma detection or byte alignment, polarity correction, 8-bit/10-bit decoding, clock tolerance compensation (e.g., clock domain transfer), lane alignment across the four lanes, and elastic buffering with 1:1 or 2:1 clock/gearbox ratio before passing the data through routing circuits 318 to programmable core circuits 302. For the input/output interface standards that are only one lane wide, the lane-alignment function is bypassed, allowing the four lanes to operate as four independent lanes.

For example, for the transmitted data, the PCS may perform various functions before passing parallel data to transmit circuits 312, such as elastic buffering with 1:1 or 2:1 clock/gearbox ratio for data received from programmable core circuits 302, flag elimination (e.g., for 10 Gbit Ethernet), idle character conversion, and 8-bit/10-bit encoding.

Routing circuits 318 provide the routing connections to programmable core circuits 302, which may include logic blocks, field programmable gate array logic, complex programmable logic, and memory along with other associated circuitry, such as buffers and registers. Arrow 332 illustrates that information is flowing to and from input/output interface 308(1) to programmable core circuits 302.

Figure 4:
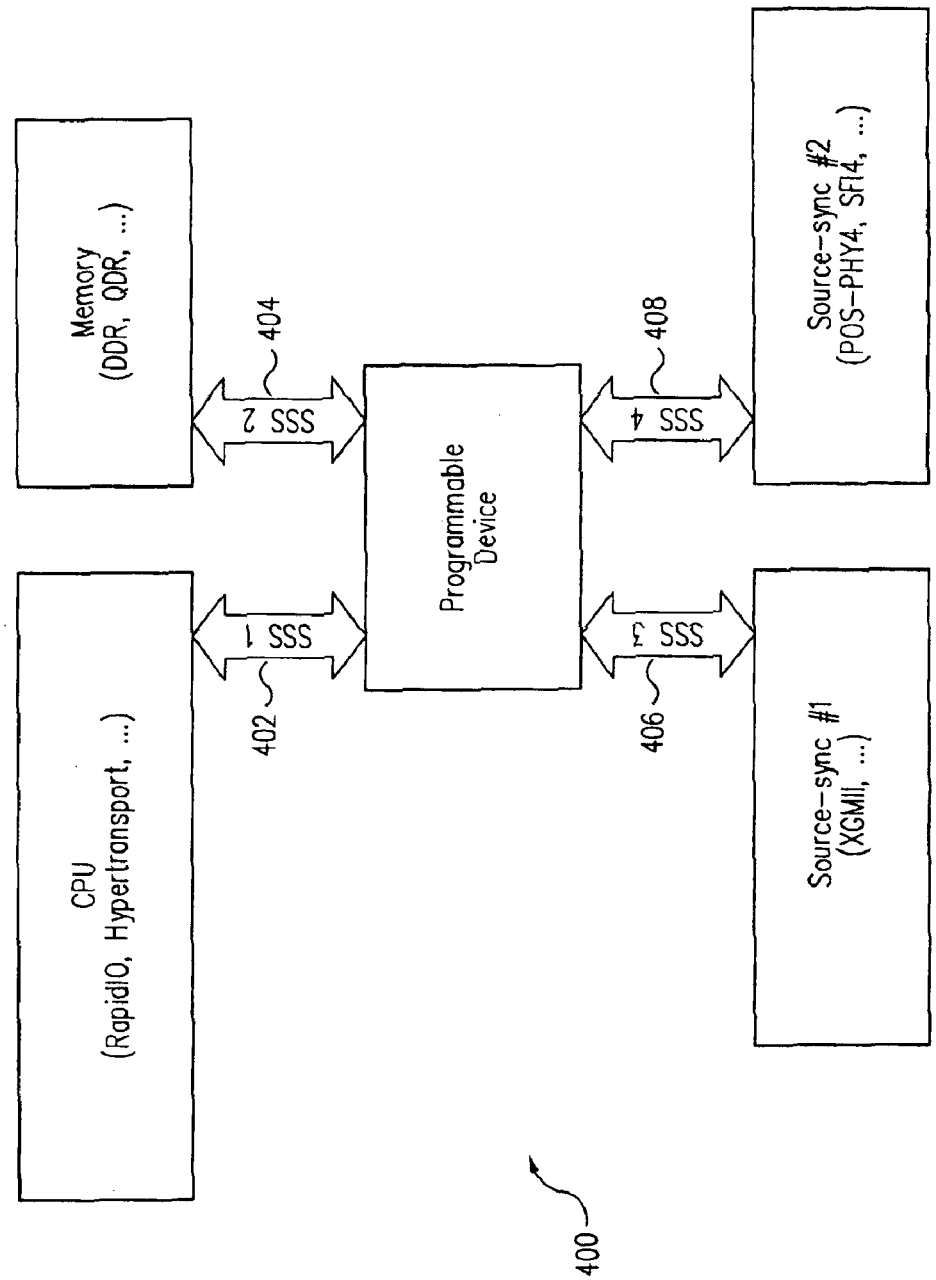
FIG. 4 shows a block diagram illustrating a device supporting four input/output interfaces in accordance with an embodiment of the present invention.

FIG. 4 shows a block diagram illustrating a device 400 supporting four input/output interfaces 402 through 408 in accordance with an embodiment of the present invention. Device 400 is configured to support the four separate input/output interfaces 402 through 408, which are for example high-speed source-synchronous input/output interfaces, by mapping each source-synchronous input/output interface 402 through 408 to one of its source-synchronous input/output circuits (e.g., input/output interface 306).

As an example, input/output interface 402 represents an interface between device 400 and a central processing unit (CPU) device utilizing a source-synchronous input/output interface standard such as Rapid IO or HyperTransport. Input/output interface 404 represents an interface between device 400 and a memory device utilizing a source-synchronous input/output interface standard such as double data rate (DDR) memory or quad data rate (QDR) memory. Input/output interface 406 represents an interface between device 400 and a device requiring a source-synchronous input/output interface standard such as XGMII. Input/output interface 408 represents an interface between device 400 and a device requiring a source-synchronous input/output interface standard such as POS-PHY4 or SFI-4.

Device 400 supports each one of input/output interfaces 402 through 408 by mapping each one of input/output interfaces 402 through 408 to one of its corresponding input/output interface circuits (e.g., input/output interfaces 306). Device 400 may contain four or more input/output interface circuits that support source-synchronous input/output interface standards and may optionally contain one or more input/output interface circuits (e.g., input/output interfaces 308) that support CDR-type input/output interface standards.

FIGS. 5 through 9 show block diagrams illustrating a device 500 with exemplary input/output interface applications in accordance with an embodiment of the present invention. Device 500 illustrates how the hard-macros, such as the source/system-synchronous hard-macros (e.g., input/output interfaces 306) or the SerDes/PCS hard-macros (e.g., input/output interfaces 308), can be configured or cascaded as necessary to support various input/output interface requirements. Input/output interface requirements may include, for example, supporting various input/output interface standards having different data rates and data widths.

Device 500 includes three SerDes/PCS macros 502 and twenty source/system-synchronous (SSS) macros 504. Four common blocks 506, one for every five SSS macros 504, are also provided, which distributes the clock and various control signals (e.g., reset) to corresponding cascaded SSS macros 504 that are associated with one of common blocks 506. An additional interface 508 is also included in device 500, with interface 508 providing a separate programmable input/output interface to support, for example, lower speed synchronous or asynchronous input/output applications or a lower speed memory input/output application.

Figure 5:
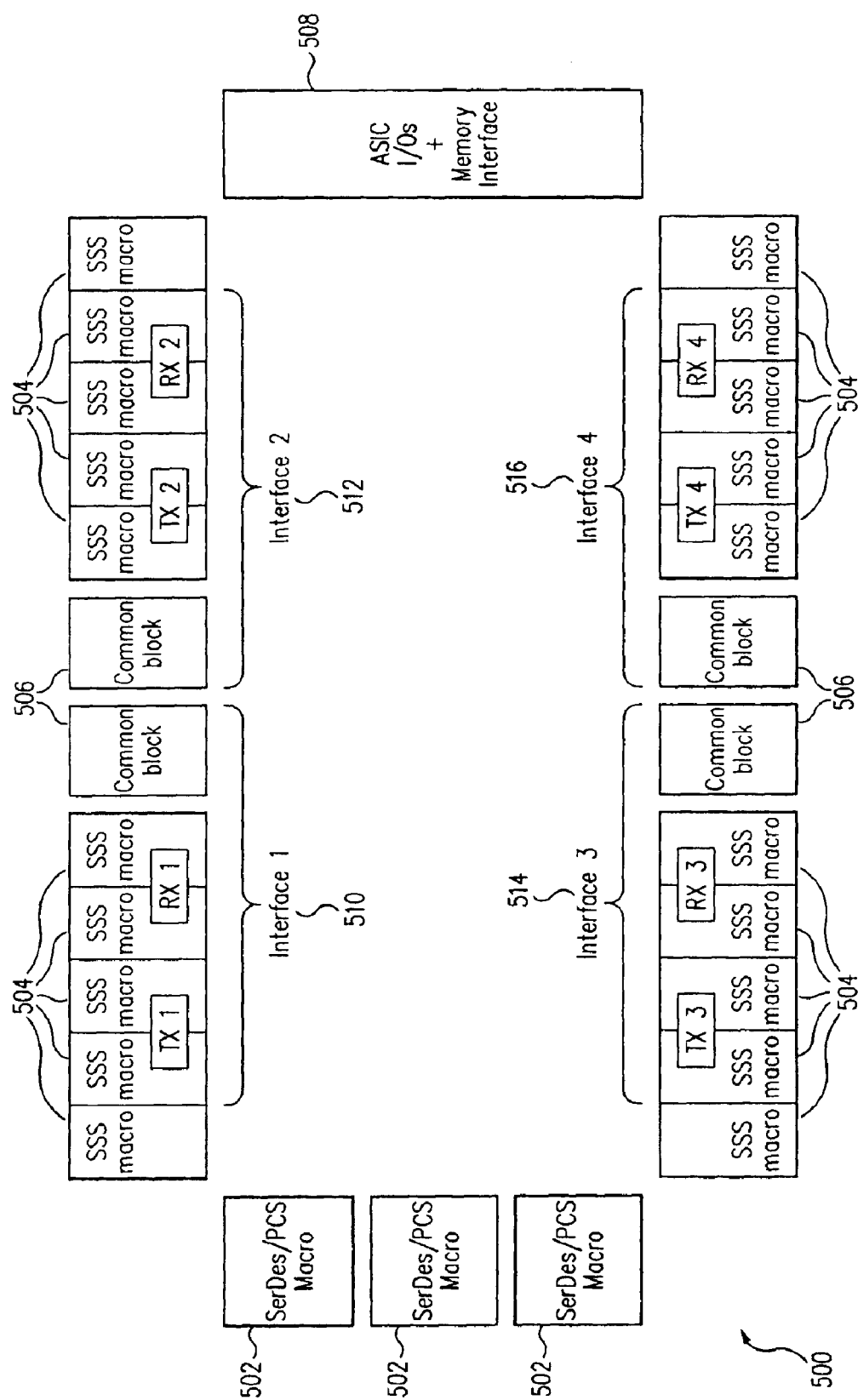
FIGS. 5 through 9 show block diagrams illustrating devices with exemplary input/output interfaces in accordance with an embodiment of the present invention.

FIG. 5 shows device 500 supporting four interfaces (i.e., interfaces 510 through 516) using only SSS macros 504. Specifically, interface 510 is supported by four SSS macros 504 (two for the transmit path and two for the receive path) and one common block 506 associated with each group of four SSS macros 504 to distribute the clock. Interfaces 512 through 516 are supported in a similar fashion by SSS macros 504 and common blocks 506.

Figure 6:
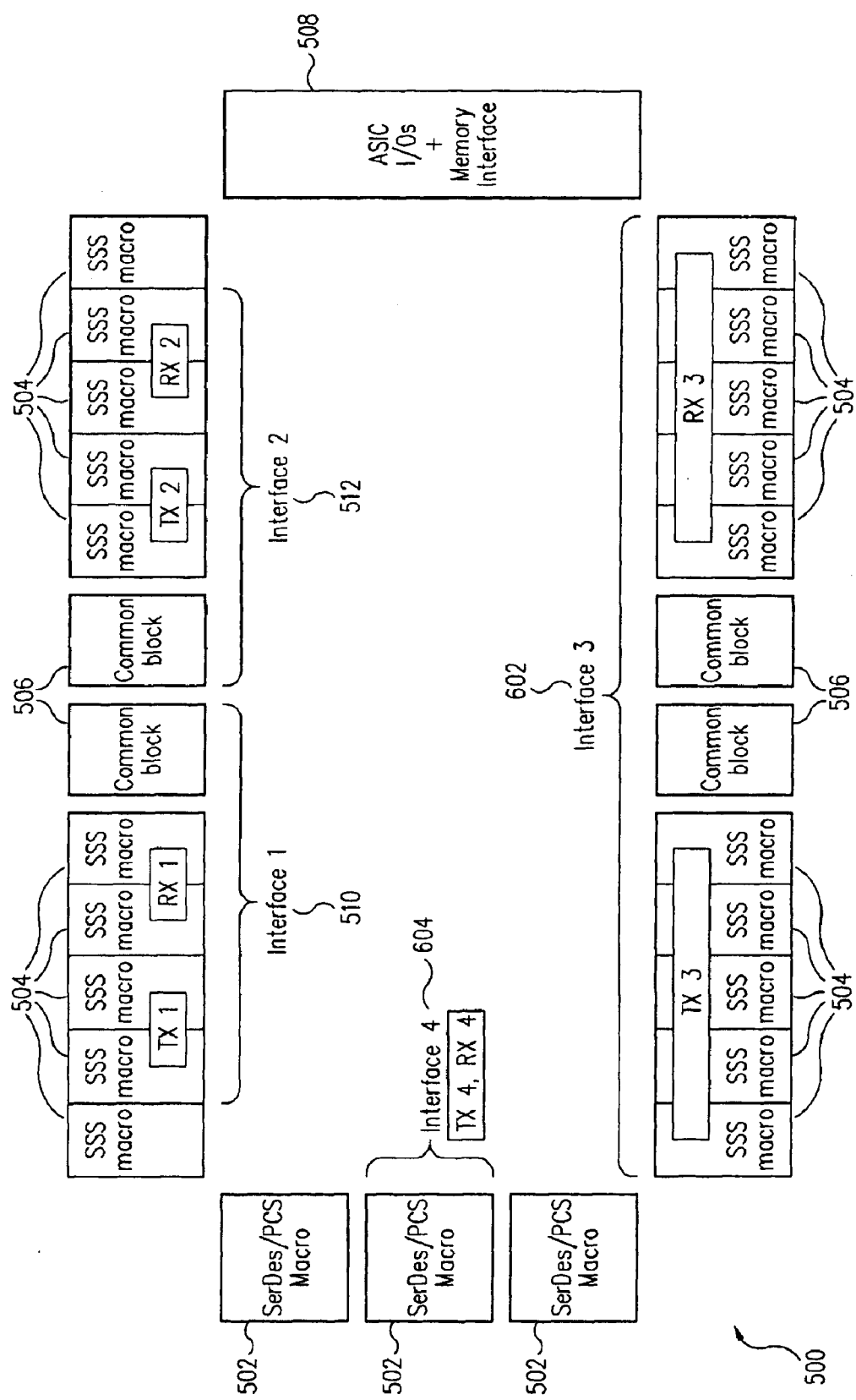

FIG. 6 illustrates device 500 supporting a different set of input/output interface applications, which include interfaces 602 and 604 (interfaces 510 and 512 remain the same). Interface 602 utilizes ten SSS macros 504, five for the transmit path and five for the receive path, and two common blocks 506 to distribute the clock. One common block 506 could distribute the clock to the receive path and one common block 506 could distribute the clock to the transmit path, or one common block 506 could distribute the clock to both the transmit path and the receive path (with the second common block 506 unused), depending upon the application and clock requirements. Interface 604 is supported by one SerDes/PCS macro 502.

Figure 7:
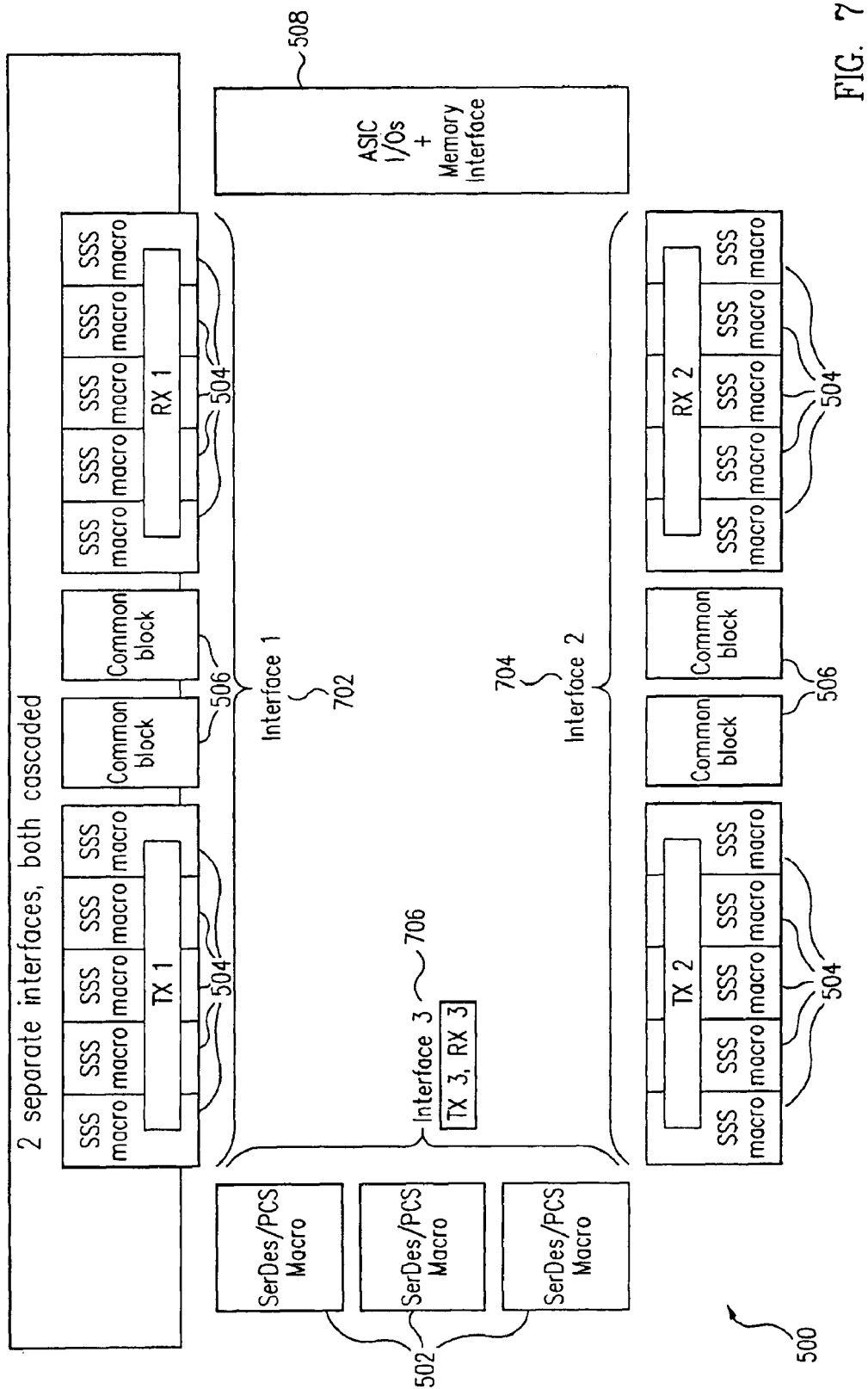

FIG. 7 illustrates device 500 configured to support three input/output interface applications. Interfaces 702 and 704 are configured in a similar fashion as interface 602 (FIG. 6). An interface 706 utilizes all three SerDes/PCS macros 502 in a cascaded fashion to provide a wide transmit and receive path. As shown, interfaces 702 and 704 are two separate interfaces, with both utilizing cascaded SSS macros 504.

Figure 8:
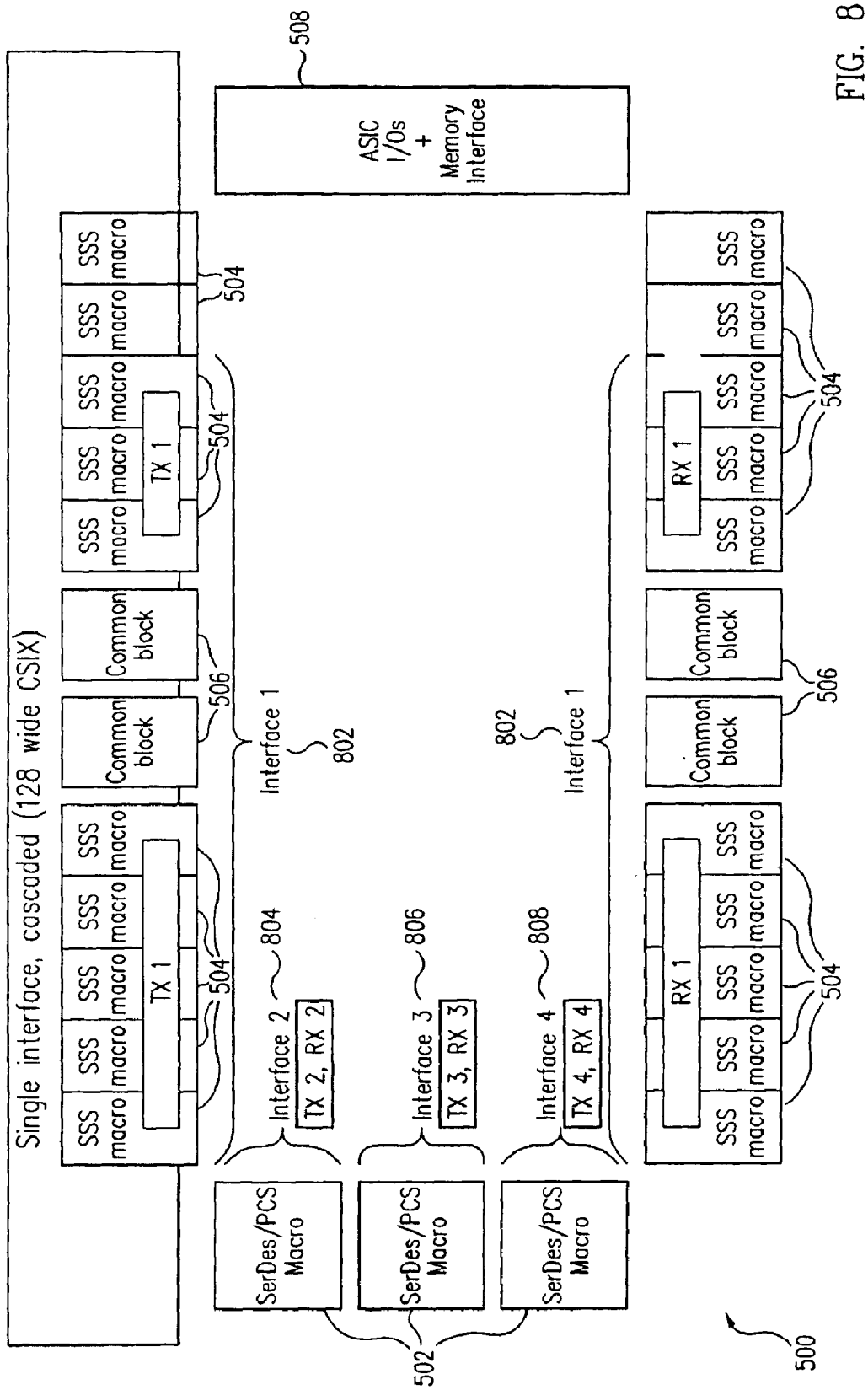

FIG. 8 illustrates device 500 configured to support four input/output interface applications. An interface 802 utilizes eight SSS macros 504 and one or two common blocks 506 to form a transmit path and eight SSS macros 504 and one or two common blocks 506 to form a receive path, as shown. For example, interface 802 is a single interface having cascaded SSS macros 504 to support a 128-bit wide CSIX input/output interface standard. Interfaces 804, 806, and 808 each utilize one SerDes/PCS macro 502 to support separate input/output interface applications.

Figure 9:
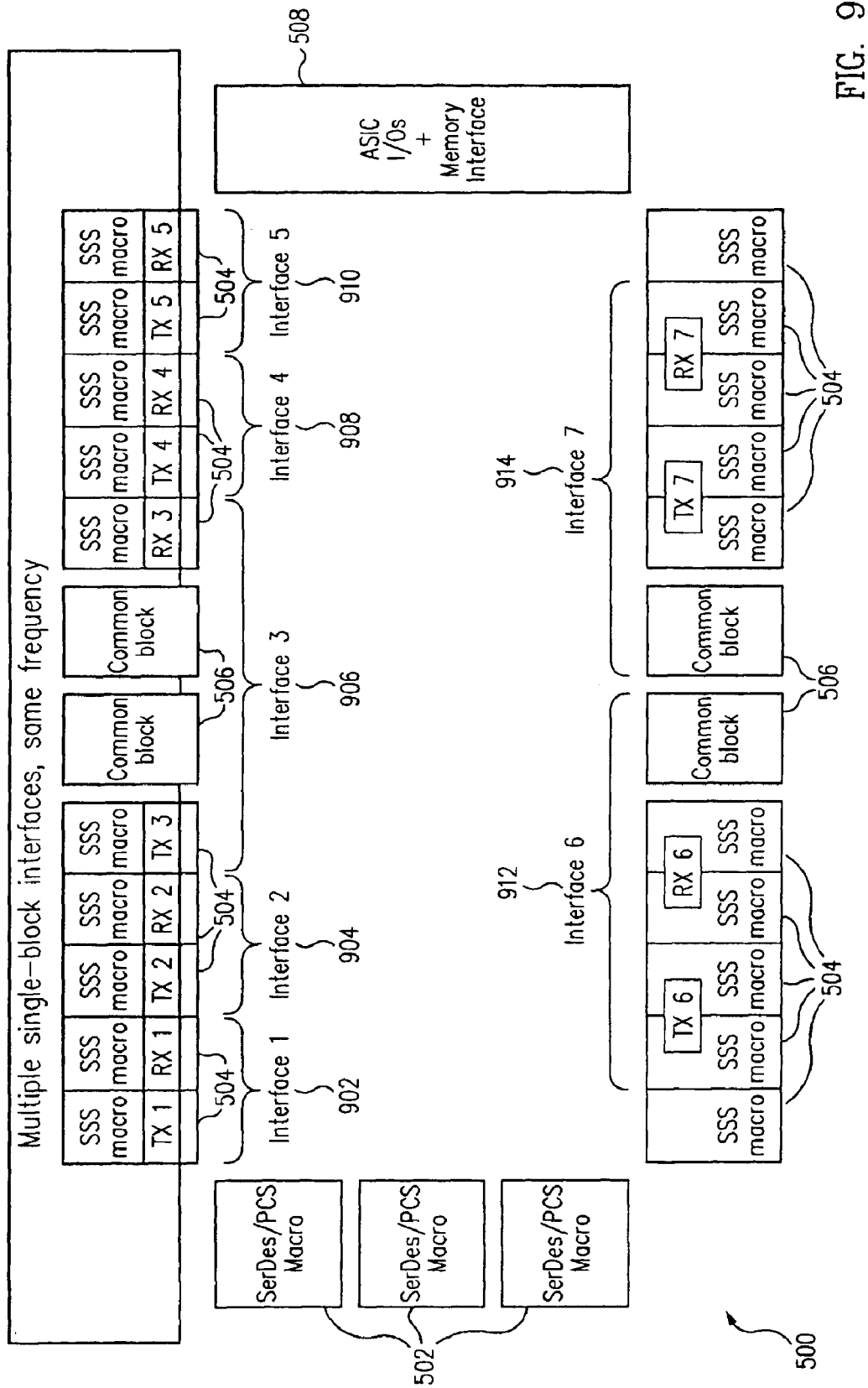

FIG. 9 illustrates device 500 configured to support seven input/output interface applications. Interfaces 902, 904, 906, 908, and 910 utilize one SSS macro 504 for a receive path and one SSS macro 504 for a transmit path. One or both common blocks 506 may be used to provide a clock for interfaces 902 through 910 if the interfaces all require the same clock rate. Interfaces 912 and 914 each utilize two SSS macros 504 for a receive path and two SSS macros 504 for a transmit path and one common block 506 to provide a common clock signal.

Figure 10:
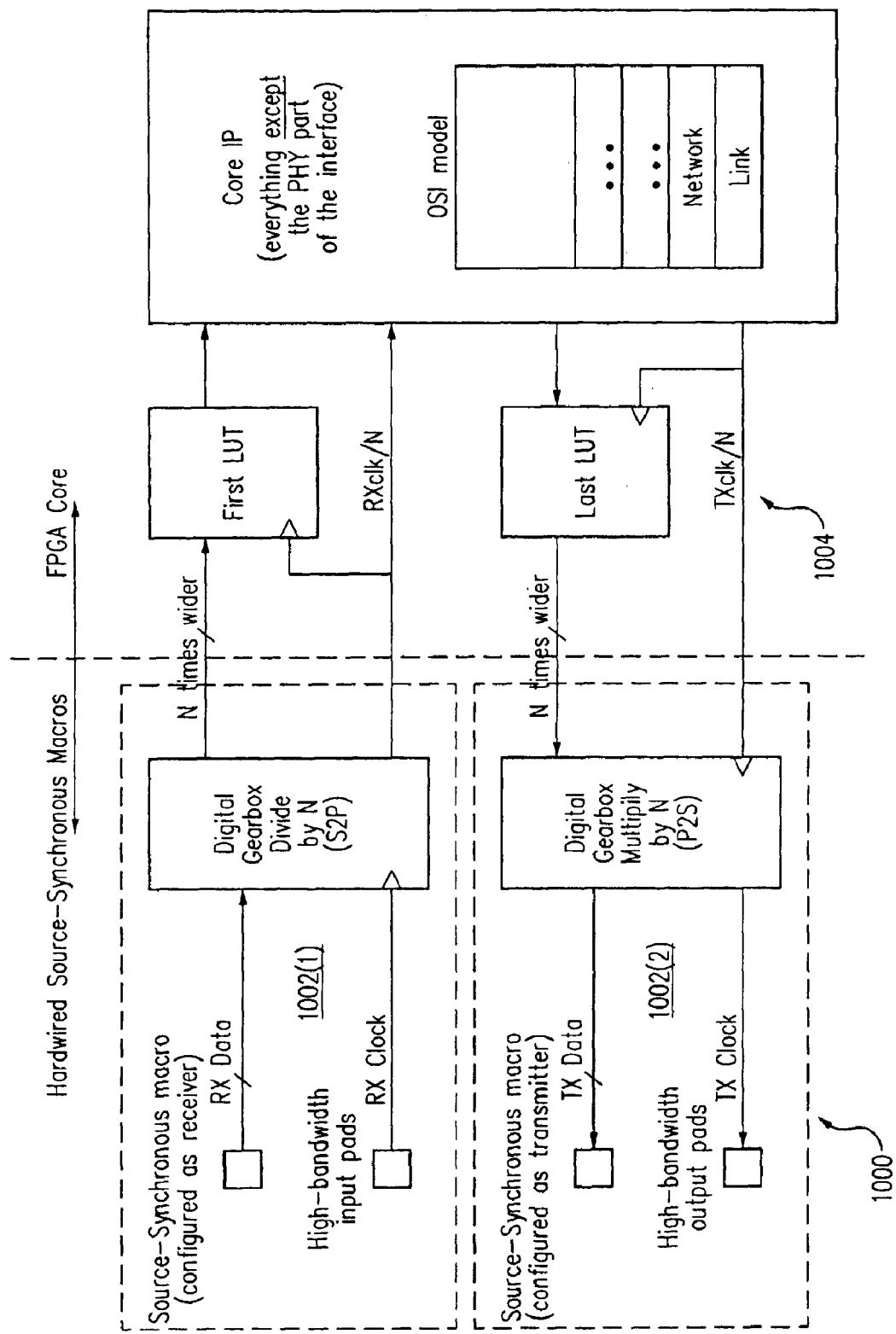
FIG. 10 shows a block diagram illustrating a device in accordance with another embodiment of the present invention.

FIG. 10 shows a block diagram illustrating a device 1000 in accordance with another embodiment of the present invention. The block diagram of device 1000 serves to illustrate the distribution of tasks between a source/system synchronous macro 1002, configured as a receiver 1002(1) and a transmitter 1002(2), and a logic section 1004 of device 1000. Receiver 1002(1) receives high-speed data and widens (i.e., increases the number of parallel paths via a digital gearbox) and slows the data to an acceptable rate for logic section 1004. Transmitter 1002(2) transmits high-speed data by reducing the number of parallel paths for the data received from logic section 1004. Note that receiver 1002(1) and transmitter 1002(2) may be configured to share pads (i.e., share input/output pads) rather than have, as shown, separate pads for receiver 1002(1) and transmitter 1002(2).

As shown in FIG. 10, logic section 1004 may, for example, represent the core logic of a field programmable gate array or other type of programmable logic device. Logic section 1004 may use some of its logic or circuitry (e.g., such as lookup tables (LUTs) or other logic that may be present within logic section 1004) to complete the logic requirements for a particular interface standard. For example as discussed above, lower speed logic required by the supported interface standard may be mapped into logic section 1004 to complete the logic requirements.

Figure 11:
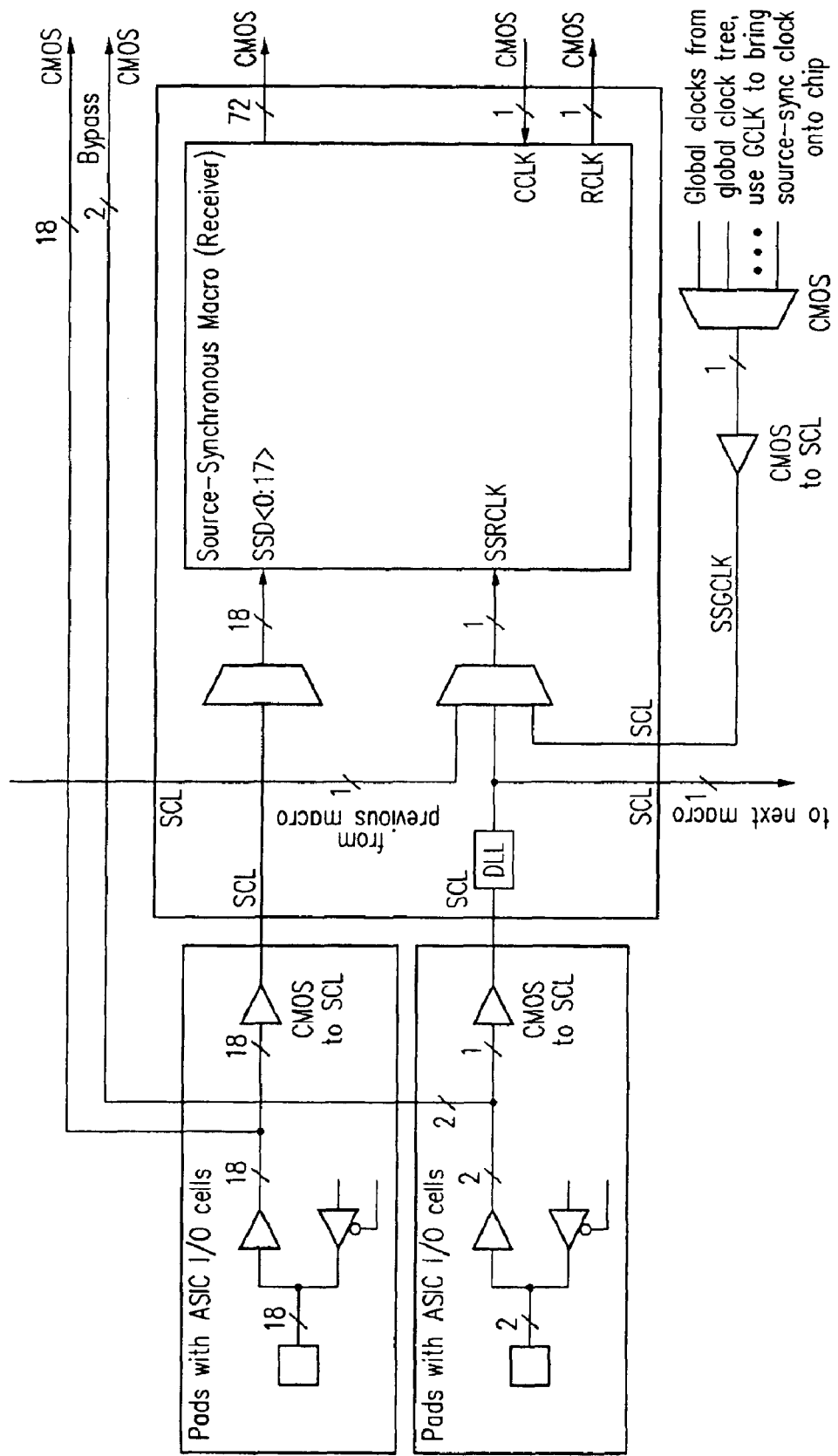
FIG. 11 shows a block diagram illustrating an exemplary clocking configuration for the device of FIG. 10.
Figure 12A:
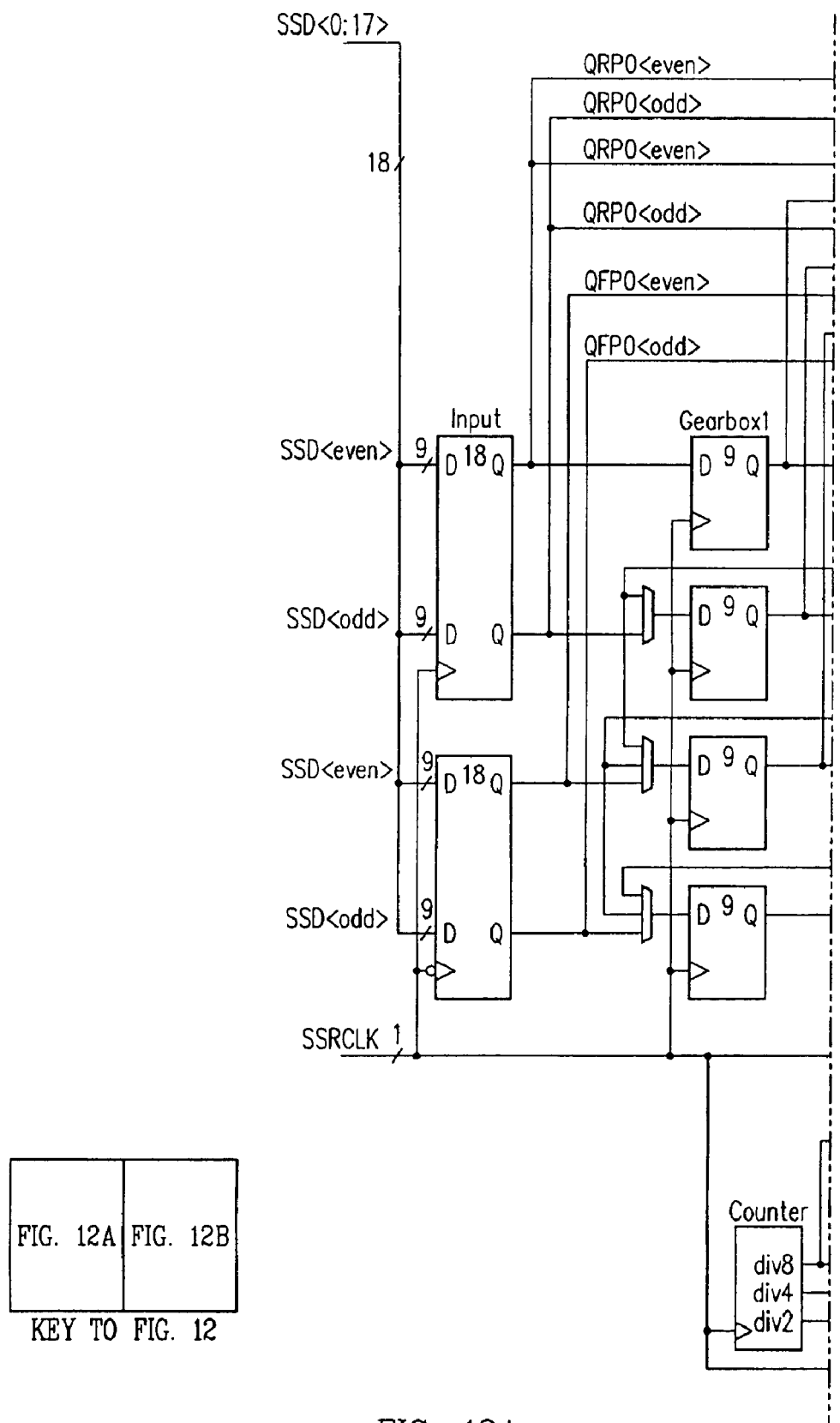
FIG. 12 shows a block diagram illustrating an exemplary receiver configuration for the device of FIG. 10.
Figure 12B:
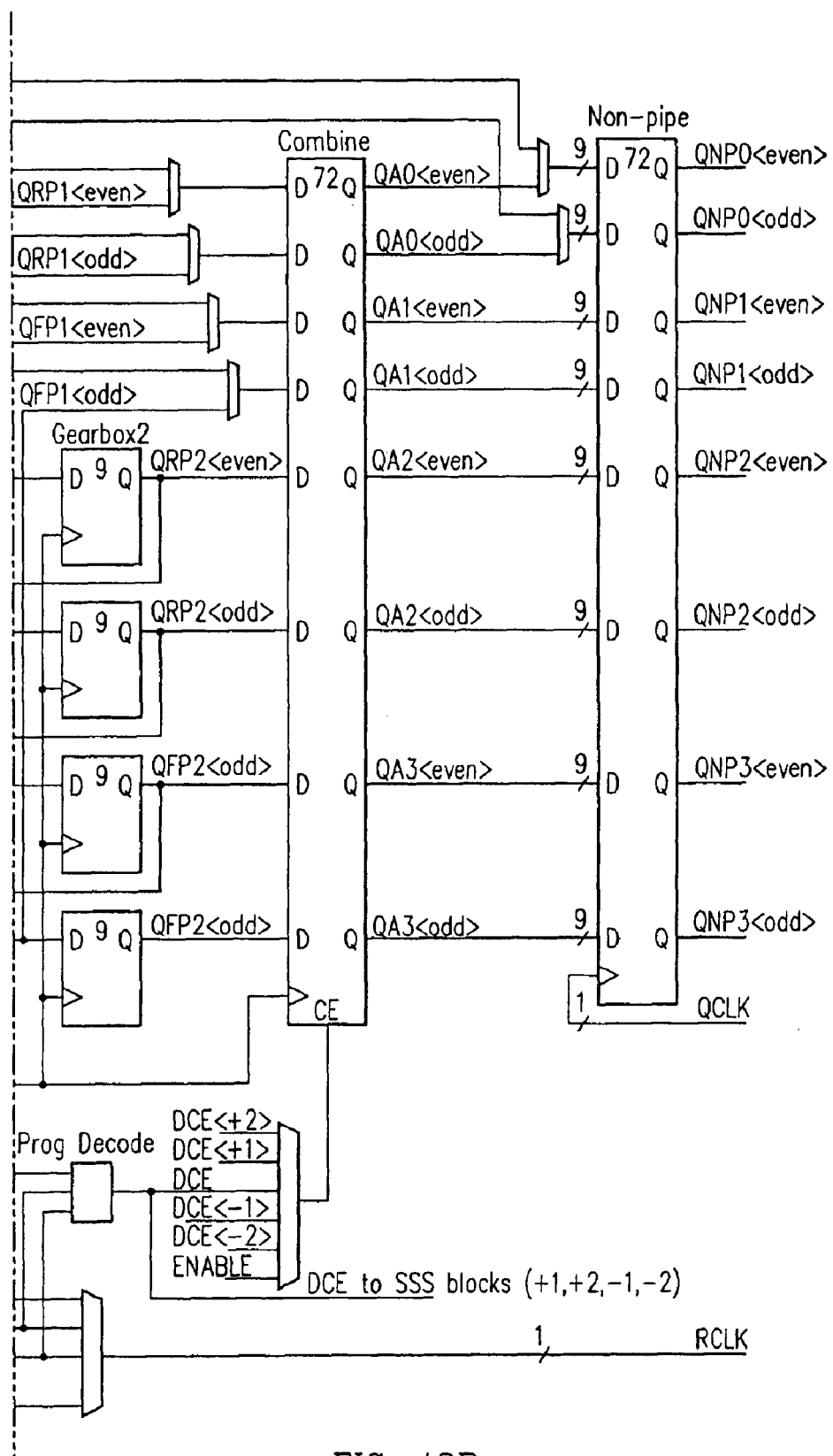

FIG. 11 shows a block diagram illustrating an exemplary clocking configuration that may be applicable for receiver 1002(1) of device 1000. Receiver 1002(1) may be clocked at a higher clock rate than logic section 1004 to accommodate various high-speed interface standards. FIG. 12 shows a block diagram illustrating an exemplary circuit diagram that may be applicable for the digital gearbox of receiver 1002(1) for device 1000.

Figure 13:
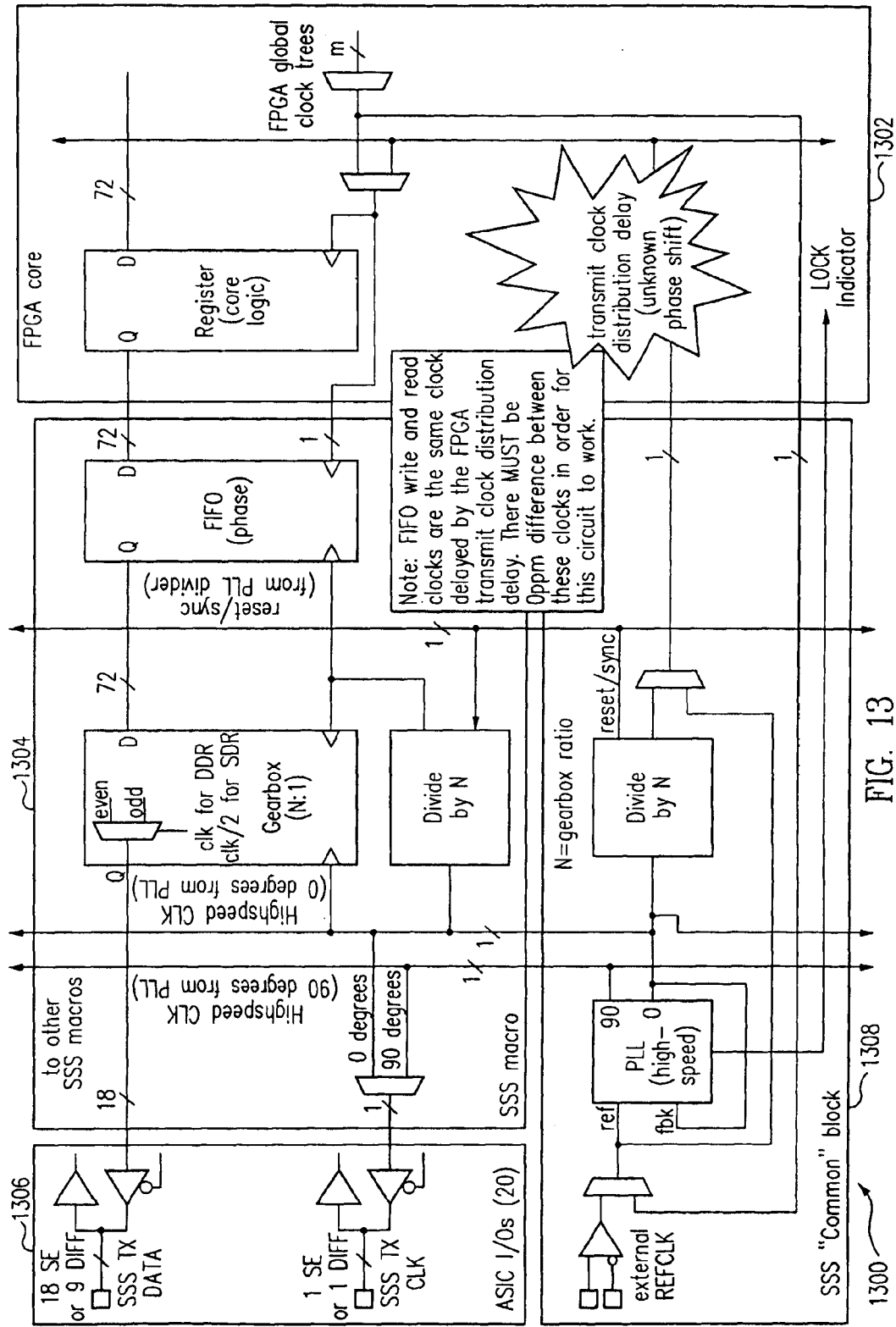
FIG. 13 shows a block diagram illustrating a device in accordance with another embodiment of the present invention.

FIG. 13 shows a block diagram illustrating a device 1300 in accordance with another embodiment of the present invention. Device 1300 includes a core logic section 1302, a source/system synchronous (SSS) macro 1304, associated pads 1306, and a common block 1308. Device 1300 may include additional macros, such as SSS macro 1304 or other macros, such as type 1 SerDes/PCS macros.

Figure 14:
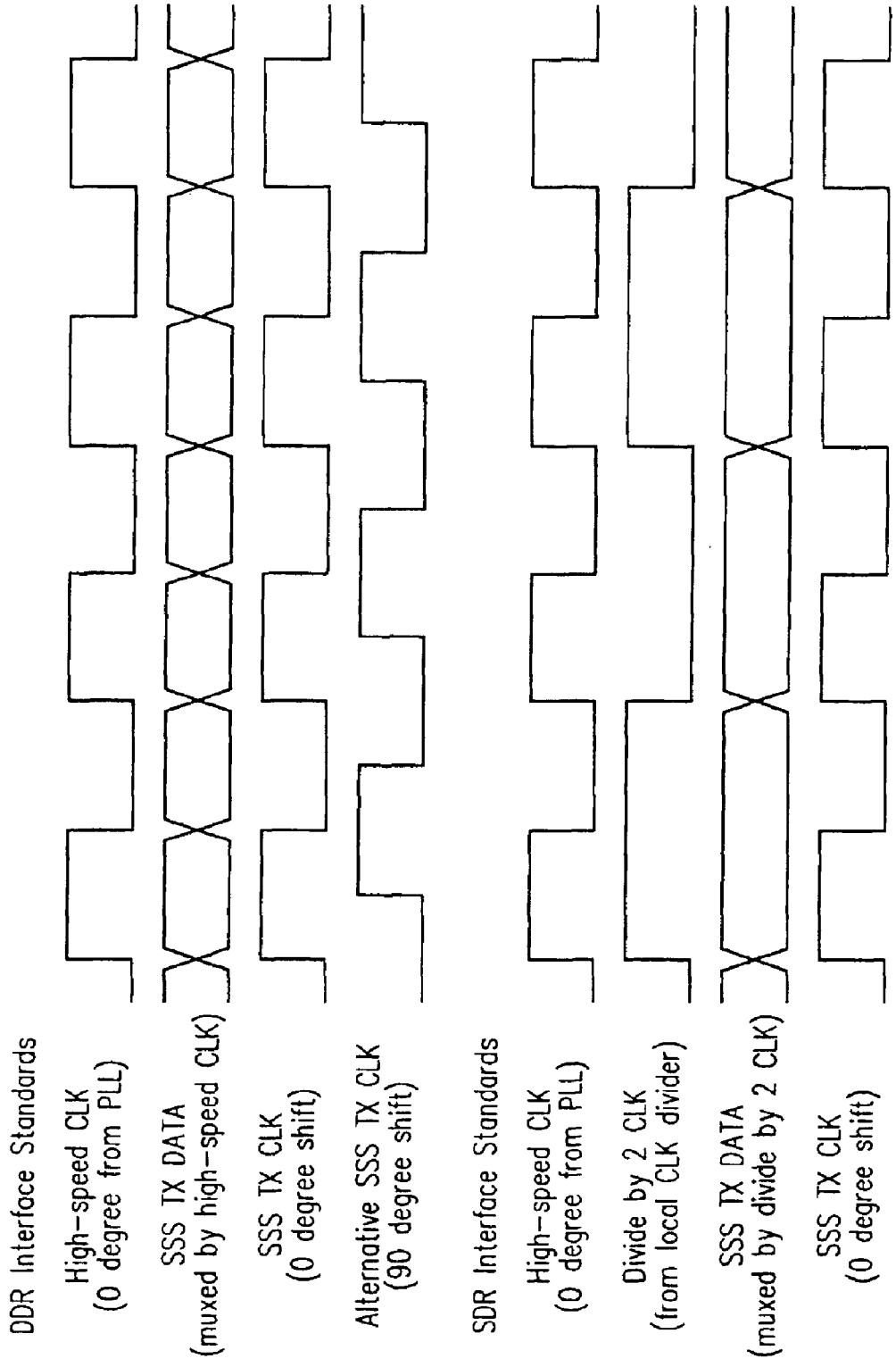
FIG. 14 illustrates an exemplary timing diagram in accordance with an embodiment of the present invention.

Common block 1308 is a block of circuitry that is employed to support more than one SSS macro 1304. For example, common block 1308 may receive a reference clock and generate and distribute appropriate clocks to SSS macros 1304 on device 1300. As an example, FIG. 14 illustrates an exemplary timing diagram for clock and data timing relationships for two exemplary source-synchronous interfaces (i.e., single data rate and double data rate interfaces).

Figure 15:
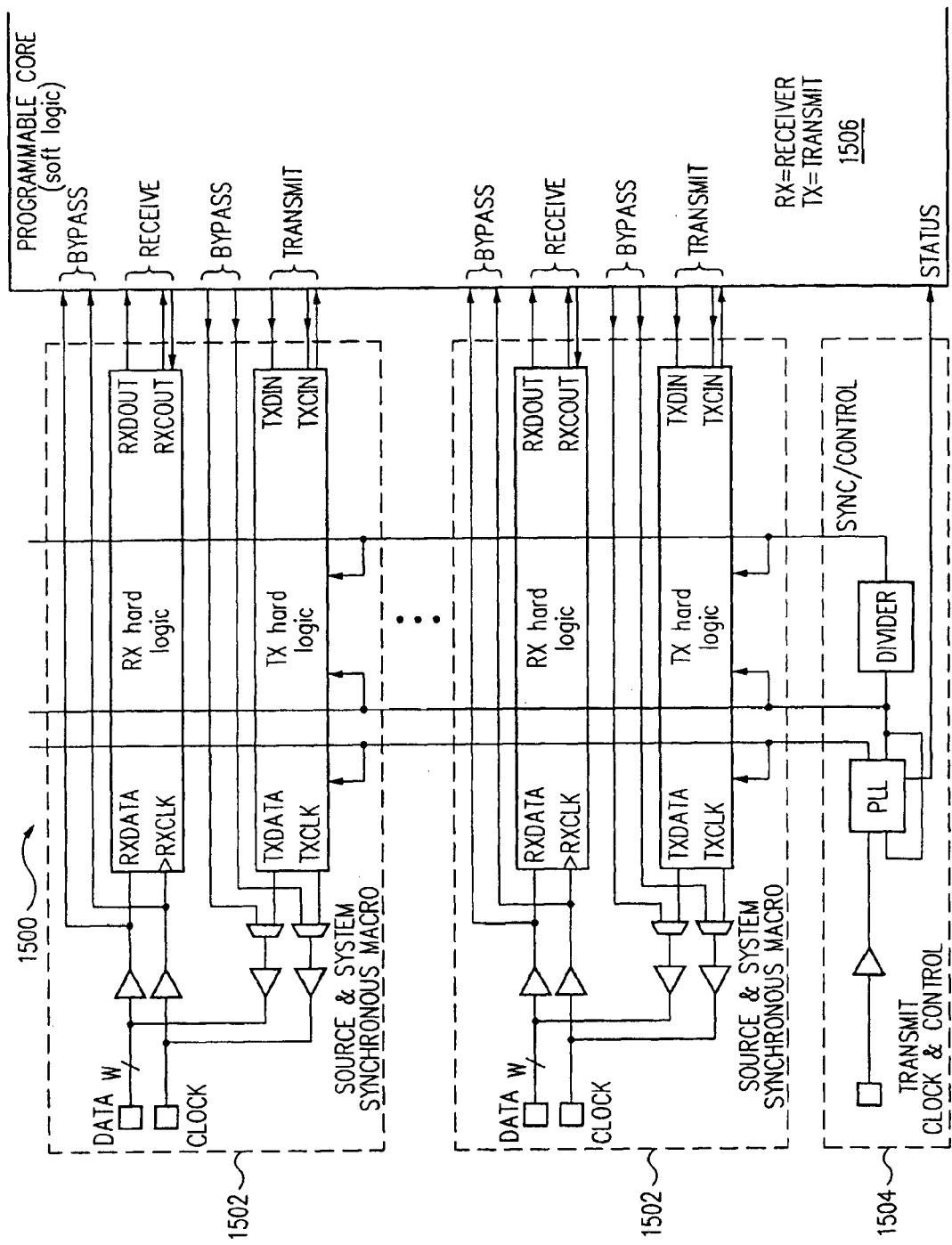
FIG. 15 shows a block diagram illustrating a device in accordance with another embodiment of the present invention.
Figure 16:
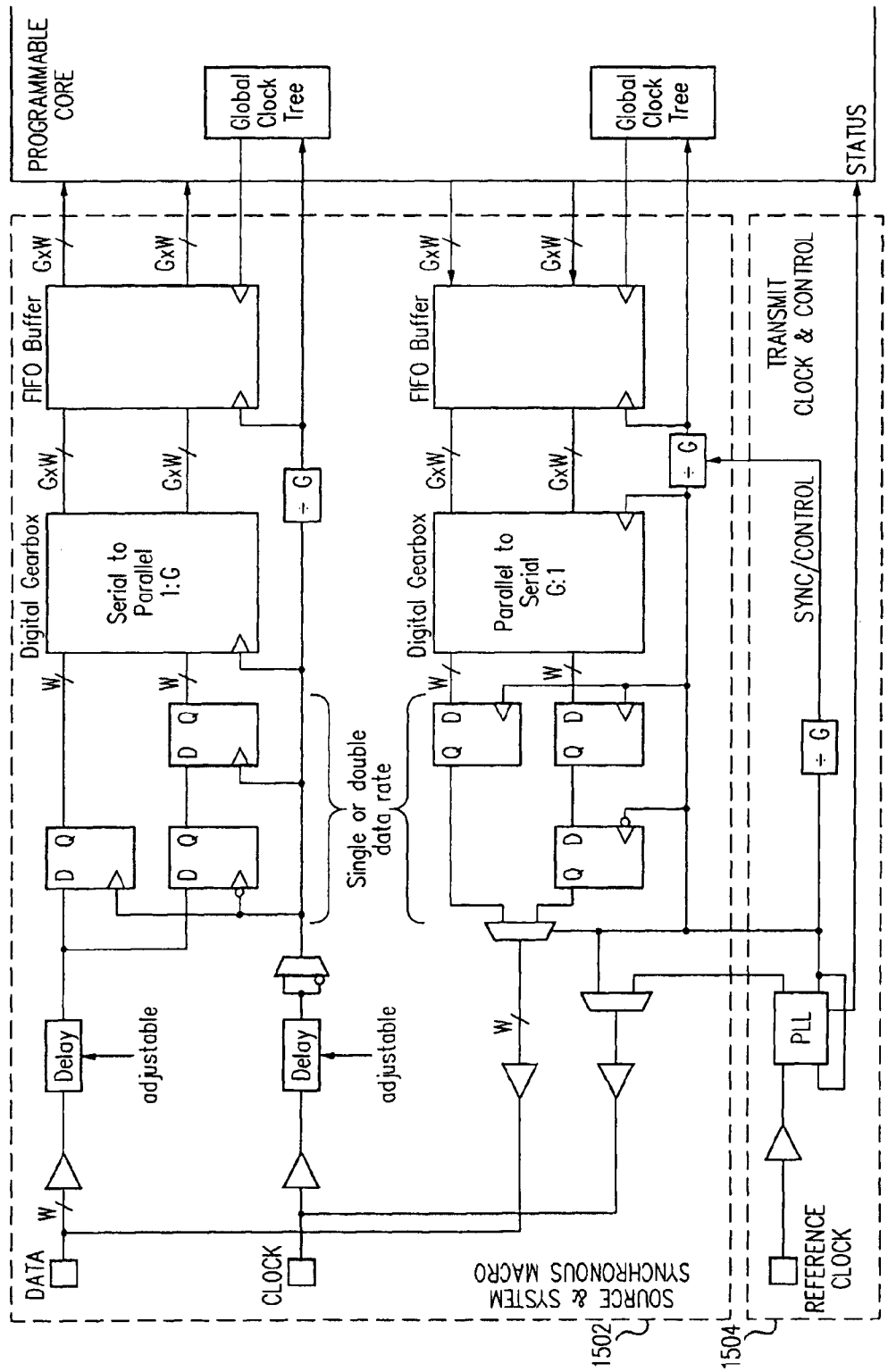
FIG. 16 shows a block diagram illustrating a detailed exemplary circuit for a portion of the device of FIG. 15.

FIG. 15 shows a block diagram illustrating a device 1500 in accordance with another embodiment of the present invention. Device 1500 includes a number of source and system synchronous (SSS) macros 1502, a common block 1504, and a programmable core 1506. Common block 1504 may be employed to provide clock and control functions to SSS macros 1502. As an example, FIG. 16 shows a block diagram illustrating a detailed exemplary circuit diagram for one of SSS macros 1502 and common block 1504.

In accordance with one embodiment of the present invention, high-performance, dedicated logic is situated between the programmable input/output drivers and the programmable core logic of the device. The dedicated logic sacrifices flexibility to gain the required performance necessary to support numerous high-speed input/output interface standards. Consequently, a separate unique circuit that supports only a specific input/output interface standard and protocol is not required for each high-speed input/output interface standard.

Each input/output interface standard is dissected or broken down into a high-performance fixed-logic section (e.g., a hard-macro circuit) and a lower-performance programmable logic section. The commonality that exists between the input/output interface standards is implemented into a single type or a few types of fixed-logic circuits to support a much larger number of input/output interface standards. The differences that exist between the input/output interface standards that are application specific and have lower performance requirements are implemented or mapped as needed into the programmable core logic of the device. Consequently, by using this and other techniques as disclosed herein in accordance with embodiments of the present invention, programmable devices are able to support high-speed input/output interface standards.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable device comprising:
    a first input/output driver;
    a first input/output circuit coupled to the first input/output driver and configurable to support a plurality of input/output interface standards requiring source-synchronous clock signals and/or system-synchronous clock signals, wherein the first input/output circuit is not configurable to support input/output interface standards requiring clock and data recovery; and
    a programmable core circuit coupled to the first input/output circuit.

2. The device of claim 1, further comprises a second input/output circuit and a second input/output driver, the second input/output circuit coupled to the second input/output driver and to the programmable core circuit, wherein the second input/output circuit is configurable to support a plurality of input/output interface standards requiring clock and data recovery.

3. The device of claim 1, wherein the first input/output driver is adaptable to support a range of electrical signaling levels.

4. The device of claim 1, wherein lower-speed logic is mapped to the programmable core circuit and higher-speed logic is mapped to the first input/output circuit to support the input/output interface standards.

5. The device of claim 1, wherein the first input/output driver is coupled to the first input/output circuit through a coupling that meets at least the minimum performance requirements required by the input/output interface standards that are supported by the first input/output circuit and wherein the first input/output circuit is coupled to the programmable core circuit through a coupling that at least meets the performance available from the programmable core circuit.

6. The device of claim 1, wherein the device comprises a programmable logic device and the programmable core circuit comprises programmable logic blocks, lookup tables, and/or macro cells.

7. The device of claim 1, wherein the first input/output circuit may be bypassed if the performance available from the programmable core circuit meets the requirements of the input/output interface standards.

8. The device of claim 1, further comprising at least a second input/output circuit coupled to the input/output driver and to the programmable core circuit, wherein the first input/output circuit and the second input/output circuit are cascadable to support wider bus widths for the input/output interface standards.

9. The device of claim 1, further comprising additional input/output circuits and additional input/output drivers, with the input/output circuits coupled to the input/output drivers and to the programmable core circuit, wherein the input/output circuits and the input/output drivers are added in a scalable fashion to support a range of sizes of the device.

10. A method for supporting a plurality of input/output interface standards by a programmable device, the method comprising:

supporting a range of electrical signaling levels;

providing configurable circuits adapted to support high-speed requirements of the input/output interface standards;

providing the ability to transfer data to and from programmable core logic within the programmable device through the configurable circuits, wherein at least one of the configurable circuits is adapted to support the input/output interface standards requiring clock and data recovery and at least one of the configurable circuits is adapted to support the input/output interface standards requiring source-synchronous and/or system-synchronous input/output interface standards.

11. The method of claim 10, further comprising providing the ability to map lower-speed logic required by the input/output interface standards to the programmable core logic and higher-speed logic required by the input/output interface standards to the configurable circuits.

12. The method of claim 11, further comprising providing the ability to bypass the configurable circuits when the performance available from the programmable core logic is sufficient for the input/output interface standards.

13. The method of claim 12, further comprising providing the ability to cascade the configurable circuits to support wider bus widths.

14. The method of claim 10, further comprising scaling the number of the input/output circuits depending upon the size of the device.

15. A device comprising:

a plurality of input/output driver circuits adaptable to support a plurality of electrical signal levels;

means, coupled to the plurality of input/output driver circuits, for supporting a plurality of input/output interface standards, wherein at least one of the input/output interface standards requires clock and data recovery and at least one of the input/output interface standards requires source-synchronous and/or system-synchronous standards; and a programmable core circuit, coupled to the supporting means, adaptable to transfer data to the plurality of input/output driver circuits via the supporting means.

16. The device of claim 15, wherein the programmable core circuit is adapted to support a portion of logic required for at least one of the input/output interface standards.

17. The device of claim 15, wherein the supporting means is bypassed and the programmable core circuit is configured to support at least one of the input/output standards when the performance of the programmable core circuit meets the requirements of the at least one input/output standard.

18. The device of claim 15, wherein the supporting means is cascadable to support wider data paths.

19. The device of claim 1, wherein the first input/output circuit comprises:

an input/output pad;

a clocking circuit;

a transmit and receive circuit; and a routing circuit.

20. The device of claim 2, wherein the second input/output circuit comprises:

an input/output pad;

a transmit circuit;

a receive circuit;

a coding circuit; and a routing circuit.

21. The device of claim 20, wherein the coding circuit is adapted to perform serial-to-parallel and parallel-to-serial conversion and further comprises a physical coding sublayer circuit.

* * * * *